United States Patent [19]

Troesch

[11] Patent Number: 4,814,695
[45] Date of Patent: Mar. 21, 1989

[54] MEASUREMENT METHOD FOR AN ELECTRICAL SIGNAL, SERIES-PARALLEL NEGATIVE-FEEDBACK MEASURING CIRCUIT, AS WELL AS USE OF THE METHOD OF THE MEASURING CIRCUIT FOR MEASURING VOLTAGE SOURCES WITH VERY-HIGH-OHMAGE INTERNAL IMPEDANCES

[76] Inventor: Jacques J. Troesch, Walchestr. 19, 8035 Zurich, Switzerland

[21] Appl. No.: 45,707

[22] Filed: May 4, 1987

Related U.S. Application Data

[63] Continuation of Ser. No. 672,606, Oct. 22, 1984, abandoned.

[30] Foreign Application Priority Data

Mar. 4, 1983 [DE] Fed. Rep. of Germany ....... 3307693

[51] Int. Cl.$^4$ ..................... G01R 19/18; G01R 17/06
[52] U.S. Cl. .................................. 324/118; 324/99 R
[58] Field of Search .................... 324/118, 99 R, 99 D; 330/10; 250/336.1, 392; 378/19

[56] References Cited

U.S. PATENT DOCUMENTS

| | | | |
|---|---|---|---|
| 2,613,236 | 10/1952 | Palevsky et al. | 324/118 |
| 2,903,523 | 9/1959 | Toomim et al. | 324/118 |
| 3,014,135 | 12/1961 | Hewlett et al. | 324/118 |
| 3,404,341 | 10/1968 | Young | 324/118 |
| 3,424,981 | 1/1969 | Erdman | 324/118 |
| 3,441,851 | 4/1969 | Savage | 324/99 R |
| 3,818,336 | 6/1974 | Marshall | 324/118 |
| 4,255,659 | 3/1981 | Kaufman et al. | 378/19 |
| 4,415,237 | 11/1983 | Fox | 250/336.1 |
| 4,580,057 | 4/1986 | Sidhwa | 250/392 |

FOREIGN PATENT DOCUMENTS

WO82/02775  8/1982  World Int. Prop. O. .

OTHER PUBLICATIONS

Applications of Operational Amplifiers; Burr-Brown Electronics Series; McGraw-Hill; 1973; p. 42.
Pasco et al., "Circuit For . . ."; Rev. Sci. Instrum.; 51 (2); Feb. 1980; pp. 246-249.
Le Journal de Physique et le Radium; vol. 16; Aug.-Sept. 1955; pp. 695-703.

Primary Examiner—Ernest F. Karlsen
Attorney, Agent, or Firm—Antonelli, Terry & Wands

[57] ABSTRACT

For measuring voltage sources with capacitive internal impedance ($Z_G$) the voltage source is connected to a charge amplifier (7) whose input capacitance comprises a vibrating capacitor (C(t)). The output of charge amplifier (7) is connected in series with negative feedback via a regulator to the input of the measuring circuit. The frequency response of this transmission line (7, PID) is designed so that a closed regulating circuit has a good follower behavior, at least up to signal frequencies corresponding to the exciting frequency of vibrating capacitor (C(t)). The vibration of the capacitor causes an amplitude-modulated alternating signal with the voltage across said capacitor to appear at output (A). This signal is filtered out (13), amplified (15), and amplitude-demodulated (17). The demodulated signal is filtered, and supplied through a high-ohmage resistance (R) as a current to the current summation node of charge amplifier (7). By heterodyning on the one hand the current through the vibrating capacitor and on the other hand a current proportional to the charge on vibrating capacitor C(t), high amplification on the input side of charge amplifier (7) is produced, whereby disturbance factors ($I_Z$) are smoothed out at its input. Residual disturbance factor influences are cancelled out when a current of the exciting frequency ($f_{mod}$) is passed through in the vicinity of the charge amplifier input.

33 Claims, 3 Drawing Sheets

MEASUREMENT METHOD FOR AN ELECTRICAL SIGNAL, SERIES-PARALLEL NEGATIVE-FEEDBACK MEASURING CIRCUIT, AS WELL AS USE OF THE METHOD OF THE MEASURING CIRCUIT FOR MEASURING VOLTAGE SOURCES WITH VERY-HIGH-OHMAGE INTERNAL IMPEDANCES

This application is a continuation of application Ser. No. 672,606, filed Oct. 22, 1984, now abandoned.

The present invention relates to a measuring method for an electrical signal with the aid of a series-parallel negative feedback circuit, comprising an input amplifier with a vibrating capacitor connected on the input side, whose charge is influenced by the signal to be measured, wherein the oscillation-controlled alternating voltage of the vibrating capacitor is measured and demodulated to an amplitude-dependent signal, and a signal dependent thereon is fed back to the input, as well as a series-parallel negative feedback measuring circuit and a use of the method or the measuring circuit for measuring voltage sources with very-high-homage internal impedances.

STATE OF THE ART

Figure 1:
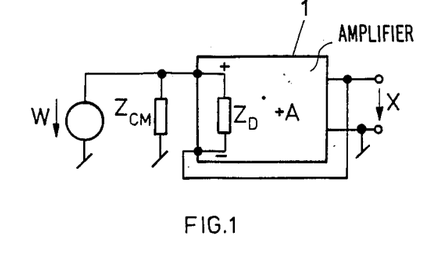
FIG. 1 shows schematically an amplifier connected as a voltage follower.
Figure 2:
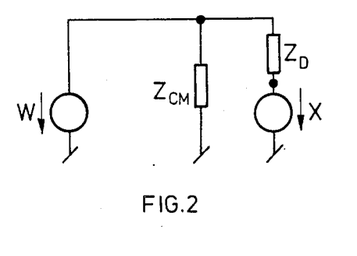
FIG. 2 shows the input equivalent-source circuit of the circuit according to FIG. 1.

Series-parallel negative feedback measuring amplifier circuits are known. They include for example the operational amplifier (op-amp) connected as a follower, wherein the output voltage is fed back to the input voltage. FIG. 1 shows the schematic of an amplifier connected as a follower. The signal W to be measured, as the reference input, is supplied to the positive input of amplifier 1, output signal X as the controlled variable is negative feedback to reference input W, by connecting it to the negative input of amplifier 1. The amplification of amplifier 1 is designated +A. If we examine the input impedance ratios offered to reference signal source W, it is evident that, in the first place, the common mode impedance $Z_{CM}$ must be included in the calculation and secondly the differential input impedance $Z_D$. It is evident from the corresponding input equivalent circuit in FIG. 2 that, since only the control deviation of the circuit appears or the differential input impedance $Z_D$, the latter is negligible, but not the common mode impedance $Z_{CM}$. The maximum attainable input impedance with such a circuit is therefore the common mode impedance $Z_{CM}$ which, for lowest frequencies, usually varies in op-amps on the order of $10^{12}$ ohms or 1T ohms. It is also known that the input current of amplifier 1 as shown in FIG. 1 flows into the reference signal source W. Reference signal sources with extremely-high-ohmage internal impedances, like those with a purely capacitive internal impedance, cannot be measured with this arrangement. It is known that the input currents of op-amps connected as followers are measured as follows: a capacitor is connected between ground and the positive input, and the current flowing into the capacitor is determined from the voltage rise at output X per unit time.

Figure 3:
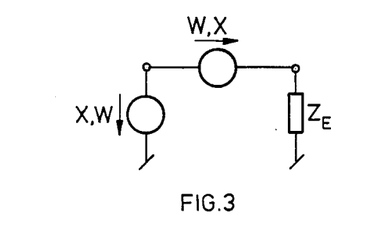
FIG. 3 shows the equivalent-source circuit of a series parallel negative fed-back circuit.

First of all, to fully utilize the principle of series-parallel negative feedback for increasing the input impedance of a measuring amplifier circuit, the input equivalent circuit diagram as shown in FIG. 3 must be designed. The input impedance $Z_E$ of the measuring amplifier circuit now appears in series with reference signal source W and controlled variable source X.

Figure 4A:
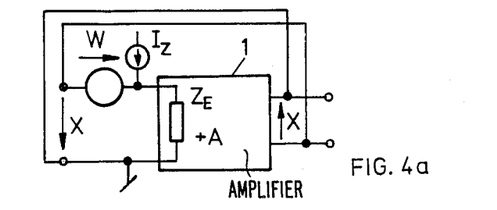
FIG. 4a shows schematically an amplifier circuit connected for negative series parallel feedback, whereby the reference signal source (W) is floating and the controlled variable source (X) is set on a reference potential.
Figure 4B:
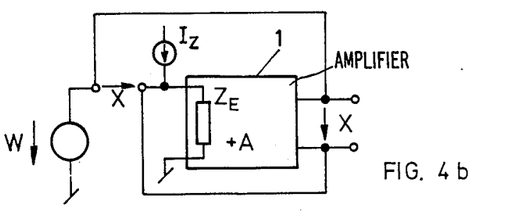
FIG. 4b shows schematically a further series parallel fed-back coupled amplifier circuit, whereby a controlled variable source (X) is floating and the reference signal source (W) is operated at a reference potential.

In FIGS. 4a and 4b the two configurations are shown as block diagrams and in FIG. 4a the reference signal source W is floating and in FIG. 4b the controlled variable X.

Various proposals have been made for utilizing the principle according to FIGS. 3 and 4 for measuring amplifier circuits with extremely high input impedance. Reference should be made in this connection for example to "Applications of Operational Amplifiers" from Burr-Brown, Electronics Series, McGraw-Hill, 1973, page 42, where the voltage source to be measured, the reference signal source, is connected between the inverting input and output of an operational amplifier. The noninverting input is connected to ground for example. In this arrangement the input impedance, as viewed from the reference signal source, is provided by the impedance between the input and output of the op-amp. Another embodiment of this principle for producing measuring amplifier circuits with an extremely high input impedance is described in "Rev. of Scientific Instr.," Vol. 51 (1980) Feb., No. 2, New York.

Figure 5:
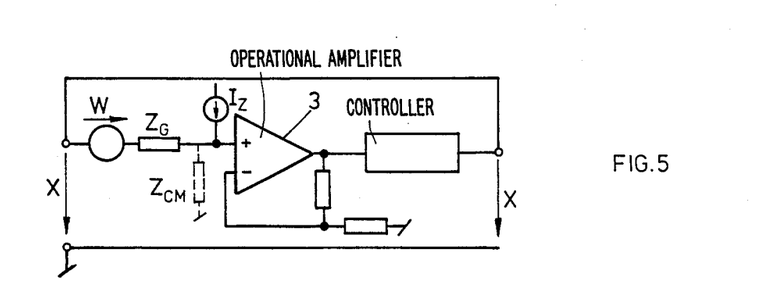
FIG. 5 shows schematically a known series parallel negative fed-back coupled measuring circuit.

Under the title "Circuit for the Measurement of Surface Potential Changes by the Static Capacitor Method," the principle of the circuit shown in FIG. 4a is shown. Since extremely high input impedances can be achieved with this principle (the input impedance of the amplifier is stepped up by amplification of the open control circuit) it becomes possible to measure voltage sources with very high internal impedances, and in extreme cases, capacitive dc voltage sources. This method, known as the "static capacitor method," is used there to determine potential changes during the adsorption of gases on metal foils. The circuit design used in this article is shown basically in FIG. 5. Signal source W to be measured is connected through the internal impedance of source $Z_G$ to an op-amp 3 which is connected as a noninverting amplifier, the output of said op-amp 3 being fed back to the input through a controller. The controlled variable X is evaluated. The internal impedance of reference signal source W is practically purely capacitive. The disadvantage of this circuit is that a voltage divider is created by the internal impedance $Z_G$ and the common mode impedance $Z_{CM}$ of op-amp 3. In view of the fact that internal impedance $Z_G$ becomes much greater at low frequencies than the common mode impedance $Z_{CM}$ of op-amp 3, ($Z_G$ is a vacuum capacitance) it is evident that to achieve good follower accuracy of controlled variable X with reference to reference input W, the amplification of op-amp 3 and of the controller connected on the load side must compensate for this attenuation.

Figure 6:
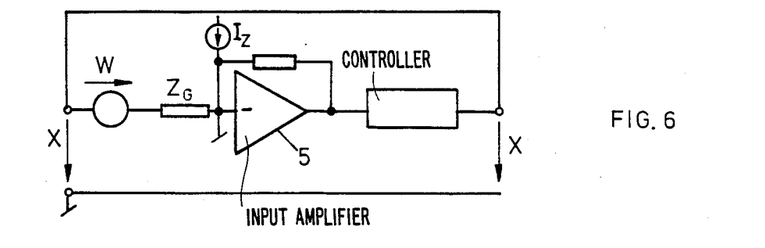
FIG. 6 shows another known series parallel negative feedback amplifier circuit.

The circuit principle illustrated in FIG. 6 is much more advantageous in this respect, wherein an op-amp in the inverting circuit configuration is used as input amplifier 5. This principle is disclosed in the PCT application, published under No. WO 82/02775 of the same applicant as the present application. Basically, the method illustrated in FIGS. 3 to 6 can exhibit very good dynamic behavior, wherein the controller provided can be so designed that the open control circuit exhibits high amplification even at high frequencies. In addition, measuring circuits designed according to FIGS. 3 to 6 exhibit extremely high input impedances. Thus for example, as shown particularly in FIG. 6, input impedance $Z_G$, -in the case of measurement of very-high-ohmage voltage sources being the internal impedance of the source itself-is amplified with the amplification of the open control circuit, which when $Z_G$ is a pure capacitance, produces extremely high dc input impedances of the measuring circuit.

The second problem already mentioned above, however, is not solved by these known measuring methods, namely the fact that the input current $I_Z$ of the input amplifier, shown in FIGS. 4a to 6, as a disturbance factor, according to the amplification of the open control circuit, flows practically completely into the internal impedance of the source $Z_G$. This prevents a circuit of this kind from being used for long-term measurement of such high-ohmage voltage sources. If impedance $Z_G$ is a high-quality capacitance, $C_G$ disturbance current $I_Z$ causes a drift of controlled variable X according to the disturbance current time integral.

A completely different approach to producing very-high-ohmage and practically drift-free measuring circuits is known as the "vibrating capacitor method." It is known especially from "Le journal de physique et le radium," Vol. 16, August–September 1955, pages 695–703, under the title "l'electromltre à condensateur vibrant" to connect a vibrating capacitance amplifier in a series-parallel negative feedback circuit. The series-parallel negative feedback makes the measuring circuit proposed herein likewise extremely high-ohmage. The alternating voltage on the vibrating capacitor, with its amplitude modulated by the signal to be measured, corresponding to the charge applied to the vibrating capacitor, is tapped off through an ac coupled amplifier, amplitude-demodulated with phrase-information kept and connected with negative feedback to the signal to be measured. As described in this article, a relatively narrow-band selective amplifier is used as the amplifier and the amplitude-demodulated voltage is filtered by a low-pass filter before being fed back. While the influence of dc amplifier input currents practically disappears in this method because of the ac coupling, such a measuring method is relatively slow. This is because by providing a selective amplifier cuts off the higher modulation frequencies, and more are cut off by the low-pass filter at the output of the demodulation unit. In the embodiment shown in this article, the measuring circuit is used to measure current, while the voltage produced by a current to be measured through an input impedance is determined. This input impedance, a high-ohmage resistance of $10^{12}$ ohms or possibly a capacitance, is connected between the terminal of the vibrating capacitor which is not connected to ground and the fed-back output of the amplitude demodulation unit. A constant current to be measured produces a constant voltage on the high-ohmage resistance, which is measured on the capacitance provided as an input impedance, a voltage ramp corresponding to the current time integral. Measurement of extremely-high-ohmage voltage sources, as with a high-value capacitance as the internal impedance, is not provided by the method in the article cited.

DESCRIPTION OF THE INVENTION

The present invention has as its goal to provide a measuring method by which, on the one hand, a rapid dynamic following ability relative to a measuring signal is achieved, and on the other hand by achieving an extremely high input impedance, the measured signal source remains practically at zero load, and receives practically no direct current from the measuring circuit. In other words a method which makes it possible to measure the cited high-ohmage voltage sources even in long-term measurements.

On the basis of the method described hereinabove, this becomes possible by superimposing a signal which depends on the current through the vibrating capacitor with a demodulated signal which is dependent on the charge, and to use the superposition result signal as negative feedback to the signal to be measured.

In view of the fact that not only as in the known "vibrating capacitor" method, a signal which depends on the charge applied to the vibrating capacitor is negative fedback to the measuring signal but also, superimposed thereon, a signal which depends on the current through said capacitor, it becomes possible to design the dynamic behavior of the measuring method equally well, as is possible in the method of the state of the art, such as is described with reference to FIGS. 3 to 6, for example in the "static capacitor" methods. If we consider the vibrating capacitor in general as a transmission element in the control circuit, it becomes evident that there is a differential behavior between the voltage applied to the input and the flowing current, and a proportional behavior between the applied voltage and the applied charge, whereby the superimposition according to the invention with the vibrating capacitor essentially produces a PD element, relative to the voltage which is across this capacitance. If, on the other hand, we consider the current flowing through the vibrating capacitor as an input signal, the superimposition according to the invention with reference to this current input signal will exhibit PI behavior. The rapid dynamic behavior is ensured by negative feedback of the current-dependent part of the signal. It is also apparent that with a voltage as the input signal to the vibrating capacitor, the charge-dependent signal component, in other words the proportional component in this case, even before further transmission blocks, produces a high amplification, with a current as the input signal too, because the charge-dependent signal acts as the 'I' component. In this way, however, the disturbance factors, which interfere with the transmission sections, series-connected after the vibrating capacitor as the first transmission section, are leveled off.

Although it is quite possible to feed the charge-dependent and current-dependent signals before their superimposition through appropriate dimensioned transmission elements, it is proposed that the charge-dependent demodulated signal as a current signal be superimposed on the current through the vibrating capacitor. In this way the current which appears on the output side relative to the vibrating capacitor-stage is amplified with its time integral since the charge on the vibrating capacitor corresponds to the current integral.

In addition, the charge-dependent signal is preferably amplified on the alternating voltage side prior to demodulation. In this way, a P or I component of high dc amplification is obtained with the alternating voltage amplification without introducing additional dc disturbance factors.

Because the control circuit, without taking into account the time variance of the vibrating capacitor, and without heterodyning with the charge-dependent signal, is designed for at least nearly 1:1 follower behavior relative to the signal to be measured, rapid dynamic follower behavior of the circuit is achieved. If the control circuit is designed for at least nearly 1:1 follower behavior also with respect to signals with the vibrational frequency of the vibrating capacitor, a situation is produced in which, still without accomplishing the heterodyning with the charge-dependent signal, the alternating signal generated by the capacitor vibration appears at the output of the control circuit directly and in a 1:1 ratio. Then preferably the charge-dependent alternating signal is tapped off on the negative feedback controlled variable output of the control circuit. In other words the control circuit already designed for good follower behavior and which operates only on the principle of measuring the current through the capacitor is also used to measure the charge on the vibrating capacitor.

Preferably, a charge amplifier with the vibrating capacitor, at least as part of the input capacitor, is used as the input amplifier. This corresponds practically to the circuit shown in the known method in FIG. 6. The input impedance of the measuring circuit is mainly determined by the impedance of the vibrating capacitor which is increased by the amplification of the open loop control circuit. In view of the fact that the vibrating capacitor can be designed as an air or vacuum capacitor, it is evident that the circuit input impedance becomes extremely high. When using this charge amplifier, the signal which depends on the charge-dependent signal will be fed as a current signal to a current summation point on the charge amplifier.

It is known that it is very difficult and costly in a vibrating capacitor arrangement to produce an alternating voltage whose amplitude will be exactly zero when the externally applied charge is also zero. There can be a great many reasons for this. On the one hand it is known that vibrating capacitor plates made of the same metal, because of the different exit potentials, can stay at different potentials even without external application of a charge, producing an alternating voltage amplitude which is not equal to zero, and on the other hand the vibrating capacitor arrangement as an arrangement of movable conductors is disposed in an environment of electrostatic fields, for example because of the dc voltage supplied to the input amplifier. In addition, during demodulation, despite subsequent filtration, it is impossible to prevent signals with the modulation frequency, phase-shifted, from mixing with similar signals through the vibrating capacitor, so that the vibrating capacitor then becomes a mixer of signals of equal frequency, a dc current source. Therefore, because these influential parameters can be separated only with great difficulty and are equally difficult to eliminate individually, it is proposed that the residual disturbance factor influences be compensated by coupling an alternating field to the circuit input, with a frequency corresponding to the capacitor vibration. This can be accomplished very simply by running a current conductor in the vicinity of the current input at a distance therefrom, said conductor carrying an alternating current of the specified frequency. Slight phase and/or amplitude changes in this alternating current provide practically ideal stable compensation.

At this point advantage of the method according to the invention should be mentioned. With reference to FIG. 6, if, as proposed, on the input side of amplifier 5, configured as a charge amplifier, a vibrating capacitor is connected in series with the source to be measured, a voltage which has built up on the vibrating capacitor before the control circuit closes will disappear almost completely after the control circuit is closed. This is a very significant advantage when a capacitive dc voltage source is to be measured. If, for example, the latter is connected into the circuit before it is closed, in which circuit for example the negative feedback capacitance of the charge amplifier is still short-circuited, the voltage source will discharge to its own internal impedance and the series-connected vibrating capacitor. Since the vibrating capacitor in most cases can be made smaller than the internal capacitance of the source, practically the entire source voltage will appear across the vibrating capacitor. When the control circuit closes, this voltage on the vibrating capacitor will quickly be cancelled out by the appearance of a high alternating signal. The resultant current surge through the signal source and the vibrating capacitor will reduce the voltage on the vibrating capacitor nearly to zero, whereby the charge conducted through the current surge from the vibrating capacitor, because of the series circuit, also corresponds to the charge which was applied to the source internal capacitance. This makes it possible to measure the source voltage itself without the latter having had a chance significantly to discharge to its internal capacitance.

In addition, a series-parallel negative feedback measuring circuit with an input amplifier with a vibrating capacitor connected on the input side is proposed as well as with a demodulation unit on the load side for the vibrating capacitor produced alternating signal, whereby a signal which depends on the output signal of the demodulation unit acts on the input of the measuring circuit.

According to the invention this circuit is characterized by the fact that a heterodyning unit is provided for a signal which depends on a signal which depends on the current through the vibrating capacitor and for a signal which depends on the vibrating capacitor charge, whose output is fed back to the measuring circuit input relative to a signal to be measured.

Preferably, a charge amplifier with the vibrating capacitor, at least as part of the input impedance, is provided as the input amplifier.

Then preferably a current addition node at the charge amplifier input is used as the heterodyning unit.

Preferably the transmission link from the vibrating capacitor to the controlled variable output of the circuit, per se without addition to the vibrating capacitor charge-dependent signal, is designed at high amplification, at least up to the exciting frequency of the vibrating capacitor.

Thus the charge-dependent signal appears as an alternating signal component at the output of the control circuit which is now closed. The vibrating capacitor acts as an amplitude modulator relative to the voltage across it. Preferably an ac coupled amplifier is connected on the load side to the controlled variable output of the circuit, the output of said amplifier being fed to the demodulation unit, the latter for amplitude demodulation.

It has been found that demodulation can be accomplished in different ways, for example by using an analog multiplier, in which the alternating signal tapped off the controlled variable output is multiplied by a phase-adjustable reference alternating signal of the same frequency. However, as we have already mentioned, since the voltage across the vibrating capacitor is smoothed out to practically zero, it is apparent that the amplitude information is of less importance than providing regulation relative to the phase between the tapped-off alternating voltage and the reference alternating voltage, in other words the phase between the reference and the tapped-off signal is regulated to $\pi/2$. From this fact, namely that with sufficient amplification to the tapped-off alternating signal component, regulation to the phase position between the vibrating capacitor voltage and the reference alternating voltage can be achieved, preferably a pulse shaper is connected on the load side to the controlled variable output through a high-pass filter, the output signal from the shaper being fed to the demodulating unit, whereby the latter comprises a EX-OR unit, to one of whose inputs said output signal and to whose other input a phase reference signal is fed, and by the fact that the output of the EX-OR unit switches a bipolar dc signal. In this way, only the phase information from the vibrating capacitor alternating signal relative to a phase reference signal is evaluated, and for example switches plus-minus dc signals with an analog switch, corresponding to the relative phase shift of said signals. The dc component generated by switching the bipolar dc signals is then the signal which depends on the vibrating capacitor charge and is superimposed on the signal which depends on the current through the vibrating capacitor.

In order to achieve an extremely good decoupling of the measuring circuit from the exciting signals for the vibrating capacitor, it is further proposed that the vibrating capacitor be excited by a vibrating column of air. This is preferably accomplished in such fashion that one plate of the vibrating capacitor is mounted on a vibrating diaphragm which is excited through an air line such as a pipe by a remote vibration-producing device such as an electromagnetic transmitter. A loudspeaker, for example, can be used as an electromagnetic transmitter.

To compensate for residual influence of disturbance factors, it is also proposed that a conductor be run in the vicinity of the input amplifier, said conductor carrying the vibrating capacitor exciting frequency ac current.

The proposed method as well as the proposed series-parallel negative feedback measuring circuit are especially suited for measuring voltage sources with very-high-ohmage internal impedances, such as capacitive dc voltage sources. Such sources include for example contact voltages on highly insulating materials such as high polymer insulators, e.g. Teflon.

BRIEF DESCRIPTION OF THE FIGURES

The invention will now be described with reference to additional figures.

DESCRIPTION OF INDIVIDUAL FIGURES

Figure 7:
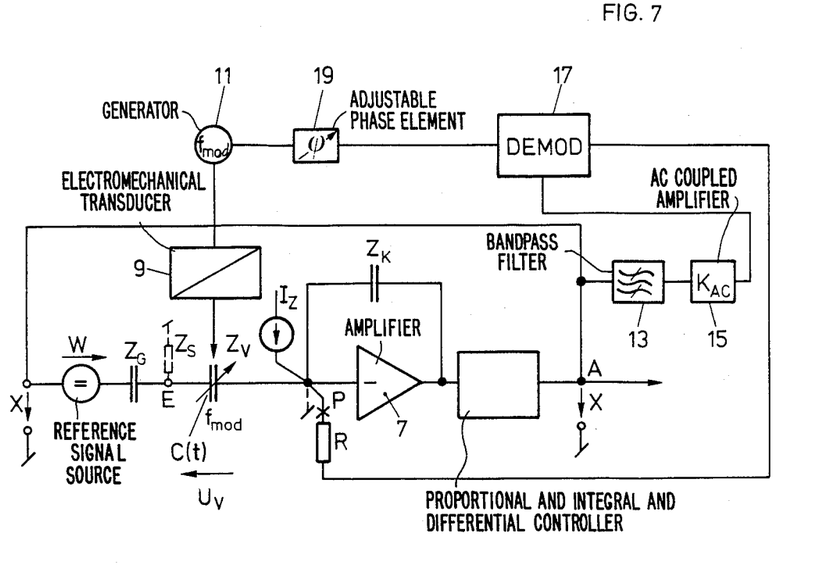
FIG. 7 is a functional block diagram of a preferred embodiment of the measuring circuit according to the invention.

According to FIG. 7, the reference signal source W to be measured, with its purely capacitive internal impedance $Z_G$, is connected to the measuring amplifier circuit input E. An op-amp 7 connected in an inverting circuit configuration as a charge amplifier has a vibrating capacitor $C(t)$ which is distance-modulated and another capacitor as the feedback impedance $Z_K$. A noninverting PID controller is connected on the load side to input amplifier 7, the output of said controller being fed to the second pole of the source to be measured, consisting of reference signal source W and internal impedance $Z_G$.

Vibrating capacitor $C(t)$ was designed as an air capacitor, with one fixed plate and one vibrating plate. For example the connection of the vibrating plate is fed to amplifier 7. Vibrating capacitor $C(t)$ is generally set vibrating by an electromechanical transducer 9. On the input side the electromechanical transducer 9 is excited by a generator 11 at frequency $f_{mod}$. Electromechanical transducers to excite the metal plate of a vibrating capacitor are known. A preferred type of excitation will be described further on with reference to FIG. 9.

Output A of the measuring amplifier circuit is tapped off on the one hand to evaluate the measuring signal and on the other hand, as shown in FIG. 7, via a bandpass filter 13 tuned to the modulation frequency $f_{mod}$ and an ac-coupled amplifier 15 to one input of a demodulating unit 17. In this fashion, the signal amplitude modulated with voltage $U_v$ and of carrier frequency $f_{mod}$ is supplied to the demodulation unit. The output of modulating generator 11 is supplied as a carrier-frequency reference signal to the second input of demodulating unit 17 through a preferably adjustable phase shifter-element 19. A commercially available analog multiplier can be used as the demodulating unit 17 for AM demodulation. The output voltage of the demodulating unit is converted into a current through a high-ohmage resistance R, which is supplied to the current summation point of amplifier 7.

In FIG. 7, the impedance $Z_S$ represented by the dashed lines represents the nonnegligible scattering impedance of input E to ground.

Figure 8A:
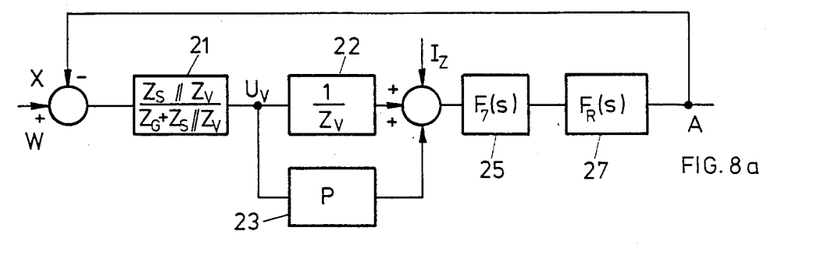
FIG. 8a is a control circuit block diagram of the measuring circuit shown in FIG. 7.

In FIG. 8a, the control circuit block diagram of the arrangement shown in FIG. 7 is shown. It should first be considered that the control circuit according to FIG. 7, without heterodyning the demodulation unit output signal with the current flowing through vibrating capacitor $C(t)$ at the current addition node of amplifier 7, i.e. with interruption of the supply line, as indicated in FIG. 7 at P, is so designed by appropriate dimensioning of the frequency responses of amplifier 7 and the PID controller, that the controlled variable X at the controlled variable output A follows as exactly as possible the sum of the voltages which is applied to the amplifier input of amplifier 7. These frequency responses are so designed that both rapid and exact follower behavior relative to the input voltage sum mentioned above is achieved. This sum is composed of the reference value W and voltage $U_v$ across vibrating capacitor $C(t)$. At output A of the measuring circuit, still with interrupted supply at P, there appears on one hand the reference signal W and secondly, a voltage component produced by noise current $I_Z$ and increasing with time as its time integral, corresponding to the integral of the current $I_Z$ at the vibrating capacitor C(t) and the internal impedance $Z_G$ of the source to be measured, and thirdly an alternating voltage signal of the frequency $f_{mod}$ whose amplitude is modulated by the voltage across vibrating capacitor C(t). Demodulation on demodulation unit 17, on the output side of the circuit, produces a voltage proportional to the voltage across vibrating capacitor C(t). A current is thus fed through high-ohmage resistance R to the input of amplifier 7 which, as mentioned above, is proportional to voltage $U_V$ across vibrating capacitor C(t), i.e. it is proportional to the charge on the vibrating capacitor. This yields the control block diagram shown in FIG. 8a.

The difference between reference value W and controlled variable X is transmitted by a first transmission function according to block 21 as the voltage $U_V$ across vibrating capacitor C(t), here generally referred to as impedance $Z_V$. The transfer function in block 21 consists of the voltage divider, on the one hand of internal impedance $Z_G$ and on the other hand of the parallel circuit composed of scattering impedance $Z_S$ and impedance $Z_V$ of vibrating capacitor C(t). The voltage $U_V$ appearing across vibrating capacitor C(t) is converted on the one hand by impedance $Z_V$ of the vibrating capacitor into the current which flows through the vibrating capacitor which, according to FIG. 7, is supplied to the current summation node of amplifier 7, virtually at ground potential, and on the other hand, however, by tapping off the alternating voltage at output A of the measuring circuit, which is proportional to the voltage across vibrating capacitor C(t), whose demodulation and coupling of a current proportional to the demodulation across high-ohmage resistor R in FIG. 7 at the current summation nodes, an additional current is fed to this point, as shown in FIG. 8a, which is proportional to the voltage $U_V$ which is applied across vibrating capacitor C(t). Thus, the current supplied through vibrating capacitor C(t) on the one hand and on the other hand a current proportional to the voltage across vibrating capacitor C(t), which therefore is proportional to the charge on the above-mentioned vibrating capacitor, is supplied to the current summation node of amplifier 7.

The transfer function in block 22 of FIG. 8a between voltage $U_V$ and the current flowing through the vibrating capacitor corresponds to the reciprocal of impedance $Z_V$ of vibrating capacitor C(t), and hence to a differential element, since it is generally true that $1/Z_v=1+sT_V/R_V$ with $R_V$ as the scattering resistance and $T_V=R_VC_V$, and also with $C_V$ as the average of vibrating capacitor C(t). The transfer function in block 23 is a proportional element. The sum of the currents supplied to the current summation node of amplifier 7 according to FIG. 7 is amplified according to FIG. 8a through an additional block 25 of transfere function $F_7(5)$, corresponding to the transfere function of current amplifier 7 with negative feedback by $Z_K$, being further connected to an additional block 27 with transfere function $F_R(s)$ corresponding to that of the PID regulator in FIG. 7; the output A of block 27 is fed back as control variable X with the correct sign to the input.

The effect of parallel block structure in blocks 22 and 23 in FIG. 8a will be better seen after a formal restructuring. For this reason in FIG. 8b block 22 is shifted in front of the branching point of the parallel structure.

Figure 8B:
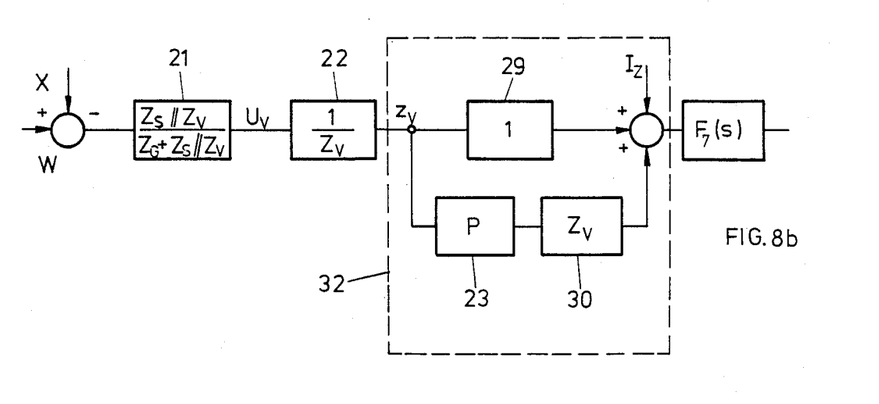
FIG. 8b is a portion of the block circuit diagram shown in FIG. 8a with a different representation.

The parallel structure thus consists of a block 29 on the one hand with a unity transfere function for the current passing through vibrating capacitor C(t) in FIG. 7, and on the other hand parallel thereto a block 23, the proportional element, and, in series therewith, an additional block 30 with a transfere function corresponding to impedance $Z_V$ of vibrating capacitor C(t). It is apparent from this representation that, with the parallel structure according to the invention, to amplifier 7, on the one hand the current flowing through vibrating capacitor C(t) is connected to it and additionally, and superimposed thereon, a current proportional to the charge on vibrating capacitor C(t), and thus a block 32 of high amplification is created. It should be considered in this connection that, without superimposing the charge-proportional current, i.e. with an interruption in P in FIG. 7, the parallel structure 32 is reduced to the unity transfere function in block 29.

In the drawing shown in FIG. 8b, with input valve $I_V$, i.e. the current passing through vibrating capacitor C(t) as the input parameter to block 32, this block 32 becomes a PI element, with very high dc amplification, in view of the fact that impedance $Z_V$ of vibrating capacitor C(t) corresponds to that of a very high-value capacitor. It is evident however that the disturbance factor $I_Z$, as shown in FIGS. 8a and 8b, for example corresponding to the input current of amplifier 7, undergoes high amplification only after block 32 and thus that this disturbance factor $I_Z$ in the circuit shown in FIG. 7 with closed feedback at P is practically completely corrected.

Figure 9:
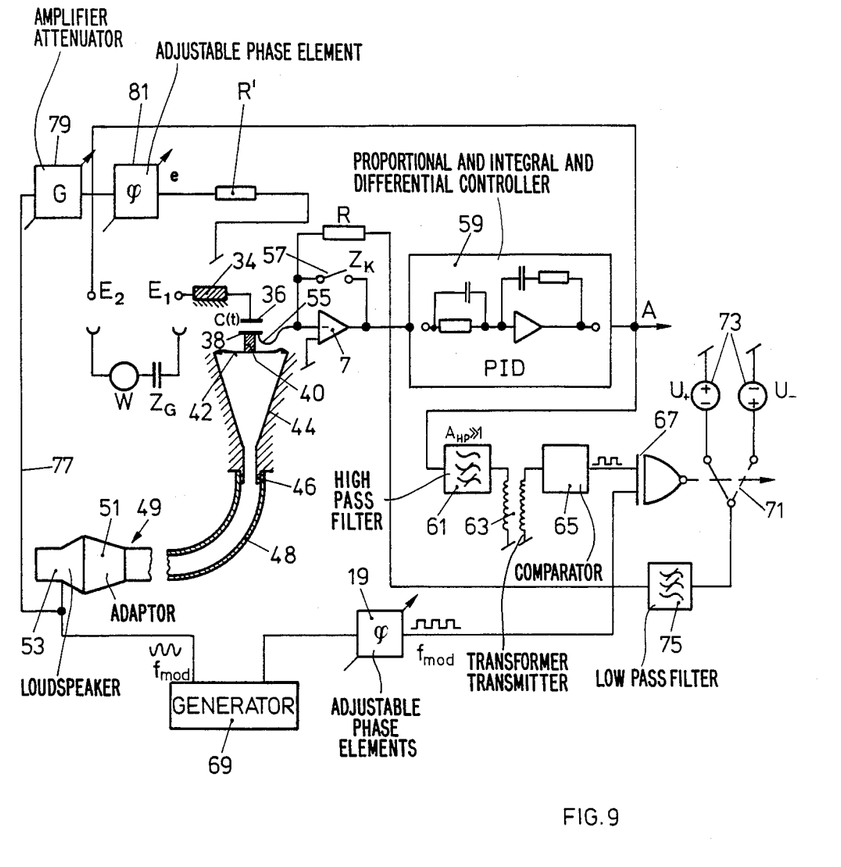
FIG. 9 is a detailed functional block diagram of the arrangement shown in FIG. 7.

FIG. 9 is a schematic representation of a preferred embodiment of the circuit shown in FIG. 7. At both input terminals $E_1$ and $E_2$ of this circuit, the real source to be measured with the ideal voltage source W as a reference signal source and internal impedance $Z_G$ are connected. Input $E_1$ is guided, highly insulated relative to ground as shown at 34, on one plate 36 of vibrating capacitor C(t). The second plate 38 of vibrating capacitor C(t) is mounted with a highly insulated socket 40 on a circular diaphragm mounted at its circumference, for example a loudspeaker diaphragm 42. Diaphragm 42 is located at the output of a conically expanded tube 44, with a hose connection 46, to which a flexible hose 48 is connected, whose second connection 49 is guided through an adaptor 51 to a loudspeaker 53.

Hose 48 can be relatively long, for example 1 meter. By exciting loudspeaker 53 the air column in hose 48 is set vibrating and excites vibrating plate 38 of vibrating capacitor C(t) via diaphragm 42. However, this ensures optimum decoupling between the electromagnetic loudspeaker excitation and the input of the measuring circuit with respect to the vibrating capacitor arrangement. Vibrating plate 38 of vibrating capacitor C(t) is connected via a flexible conductor 55 to the current summation node of amplifier 7, whose feedback impedance consists only of a highly insulated reed switch 57 which, when opened, constitutes a small capacitance $C_K$ or $Z_K$, taking into account the switch-insulating resistance. The output of amplifier 7 is connected to PID controller 59 whose output, corresponding to output A in FIG. 7, is fed back to input terminal $E_2$. Now, in contrast to FIG. 7, not a bandpass but a high-pass filter 61 is connected to output A of PID controller 59, the amplification above its cut-off frequency being much greater than 1. As a cut-off frequency, the exciting frequency $f_{mod}$ of vibrating capacitor C(t) is advantageously chosen. By providing a high-pass filter 61 instead of a band-pass filter 13 according to FIG. 7, all frequencies of and above the exciting frequency $f_{mod}$ will be transmitted, according to the laws of amplitude modulation, as well as all the frequency components of voltage $U_V$ applied across vibrating capacitor C(t). The output of amplifying high-pass filter 61 is supplied by a transformer-transmitter 63 to the input of a zero crossing comparator 65. Transmitter 63 ensures perfect dc decoupling between the output of high-pass filter 61 and the input of comparator 65. Comparator 65 thus generates a pulse train at its output with frequency $f_{mod}$, with a predetermined pulse amplitude for example on the TTL level. Its phase position corresponds, up to a transmission distance-dominated fixed shift, to that of the vibrating capacitor alternating voltage. This pulse signal is connected to an EX-OR gate 67. A demodulation-phase reference signal is supplied to the second input of EX-OR gate 67. A generator 69 on the one hand excites with a sinusoidal signal with frequency $f_{mod}$, loudspeaker 53 and hence vibrating capacitor C(t) and, via a preferably adjustable phase element 19, generates the reference phase pulse train, preferably with TTL amplitude, and with a frequency $f_{mod}$ at the EX-OR gate. The output of EX-OR gate 67 switches a switch 71 between dc voltage signal values $U_+$, $U_-$ of equal values and opposite polarity. These voltage values $U_+$, $U_-$ are preferably produced by two adjustable voltage sources 73. The output of switch 71 is fed to a low-pass filter 75 whose output is fed via high-ohmage resistor R to the current summation point of amplifier 7. The phase $\phi$ at phase element 10 is adjusted so that when the feedback is open corresponding to an interruption in P in FIG. 7, the two input signals to EX-OR gate 67 are either in phase or out of phase. By providing high-pass filter 61 instead of a bandpass filter, the layout of the low-pass filter 75, from the stability standpoint, will be less limited.

From generator 69, via a line 77, the sinusoidal loudspeaker exciting signal is converted through an amplifier-attenuator element 79 and an additional, preferably adjustable phase element 81, another resistance element R', into a current $i_{COMP}$ with frequency $f_{mod}$ which is supplied to amplifier 7 in the vicinity of the input, which gives, by inductive coupling, a possibility to compensate for the remaining disturbance factor influences in the measuring circuit with amplitude-and/or phase-adjustment of current $i_{COMP}$. Such disturbance factors can include:

a potential difference between the plates of the vibrating capacitor which is independent of the externally applied charge and consists of different contact potentials between the plates and the air between them;

small alternating currents which appear at the input of amplifier 7 because moving capacitor plate 38 is viewed as a movable conductor which moves in a field-filled space, for example because of the power lines to amplifier 7;

alternating-current components with frequency $f_{mod}$ fed back through high-ohmage resistor R are not completely filtered out, which are mixed at the vibrating capacitor with vibrating capacitor alternating signals.

With a measuring amplifier circuit according to FIG. 9, initially without compensating with alternating current $i_{COMP}$, the measurement of signal sources with internal impedance:

$R_G = 10^3 T\Omega$ $C_G = 5pF$ a drift of approximately 100 mV over 24 hours was achieved, corresponding to a residual current on the order of 10aA. However, similar results were only possible after very time-consuming changes in the geometric relationships of the capacitor plates, shielding, etc. at the input of the amplifier, as well as the plate surfaces. In the first attempt the results were poorer by a factor of 10. By compensating with alternating current $i_{COMP}$, however, results could be obtained at the first try which were readily reproducible and corresponded to a residual current of the given order of magnitude and correspondingly better, i.e. less than $10^{-17}$ A. The geometric design of the vibrating capacitor is therefore not critical, especially as regards the parallelness of the plates for example, but remains critical as far as the insulation resistance of feedthrough 34 is concerned. This feedthrough 34 according to FIG. 9 was made of saphire.

As is apparent from FIG. 8a, the voltage applied across vibrating capacitor C(t), $U_V$, is smoothed out except for a very small value. This produces the highly advantageous phenomenon described below:

If the real source to be measured with reference source W and internal impedance $Z_G$ at a short-circuit negative feedback impedance $Z_K$ is connected to the circuit by connection to terminals $E_1$ and $E_2$, the reference signal source W will charge the series-connected capacitances of internal impedance $Z_G$ and vibrating capacitor C(t). Owing to the series connection of these two impedances, the same charge will flow into both impedances. If, as is quite possible, the resting value of vibrating capacitor C(t) is made much less than the capacitance of internal impedance $Z_G$, in this state practically the entire voltage W will be applied across vibrating capacitor C(t). If, now, by opening the feedback switch on the charge amplifier, the measuring circuit is set operating, the voltage across vibrating capacitor C(t) will quickly be reduced to a small value. This voltage-or charge-drop and the series connection of the two impedances $Z_G$ and C(t) also causes a rapid decline in the voltage on internal impedance $Z_G$ which was built up there prior to the opening of switch 57 in FIG. 9. This offers the opportunity, however, to connect the source to be measured without further ado to terminals $E_1$ and $E_2$ in the circuit, then open feedback switch 57 corresponding to $Z_K$, and the practically unfalsified voltage value corresponding to W will appear at output A. This makes it possible not only to measure the dynamic behavior of reference signal source W, but also to determine its absolute value with very good accuracy.

Industrial Evaluatability

The proposed method and the proposed measuring circuit can fundamentally be used universally for measuring voltage sources which have extremely high internal impedances, whose internal impedances are for example high-value capacitances, i.e. in which the actual voltage source cannot be tapped with a conductor.

I claim:

1. A measuring circuit for measuring a voltage comprising:
    a first input tap and a second input tap adapted to be connected to a source for said voltage to be measured;
    amplifier means having a first input for receiving a signal proportional to the voltage to be measured and a second input for receiving a further signal and an output having an output signal proportional to the sum of said signal received by said first input, and said further signal received by said second input;

a capacitor coupled between said first input tap and said first input of said amplifier means;

means for producing the signal received by the second input which is proportional to a charge on the capacitor; and a negative feedback circuit coupled between said output of said amplifier means and said second input tap, for controlling said charge on said capacitor at least to approximately zero, the output of said amplifier means becoming thus proportional to the voltage of said source being measured.

2. The measuring circuit according to claim 1 wherein said capacitor is a vibrating capacitor.

3. The measuring circuit according to claim 2 wherein said vibrating capacitor has a fixed plate and a movable plate which is separated from the fixed plate by a variable distance.

4. The measuring circuit according to claim 2 wherein:
said amplifier means comprises an inverting operational amplifier having first and second inputs which correspond respectively to the first and second inputs of said amplifier means.

5. The measuring circuit according to claim 4 further comprising:
a PID controller having an input which coupled to the output of the inverting operational amplifier and an output which corresponds to the output of the amplifier means.

6. The measuring circuit according to claim 2 wherein the voltage measuring means comprises:
a demodulation means which produces an output signal proportional to the AC voltage on said capacitor.

7. The measuring circuit according to claim 5 wherein the demodulation means comprises:
a synchronous demodulator having a pair of inputs;
a time varying signal source having a frequency equal to a vibrating frequency of said vibrating capacitor which is applied to one of said inputs of said synchronous demodulator; and
a high pass filter having an input coupled to the output of the amplifier means and an output coupled to the other of said inputs of the synchronous demodulator.

8. The measuring circuit according to claim 7 further comprising a resistance coupled between said output of the synchronous demodulator and the second input of the amplifier means.

9. The measuring circuit according to claim 1 wherein said amplifier means has a current to voltage gain which functions as a controller within said negative feedback circuit.

10. The measuring circuit according to claim 9 wherein said gain is much greater than one at the signal frequency equal to the vibrating frequency of said vibrating capacitor.

11. The measuring circuit according to claim 6 wherein said output of said amplifier means is fed through a filter through a comparator to said demodulation means, said demodulation means comprising an exclusive OR circuit with a pair of inputs and an output, one of the inputs being a phase reference signal and the other of the inputs being applied from the comparator, the output of the exclusive OR circuit controlling a switch unit, said switch unit sequentially switching two DC signals of substantially equal magnitude and opposite polarities to an output line coupled to a low pass filter which is coupled to the second input of the amplifier means.

12. The circuit according to claim 11 further comprising a transformer coupled between the output of the amplifier means and said comparator to decouple any DC components in the signal applied to said comparator.

13. The circuit according to claim 7 comprising an activating oscillator for driving said vibrating capacitor, and an output of said oscillator being coupled to said synchronous demodulator as a phase reference signal.

14. The circuit according to claim 13 wherein said vibrating capacitor is excite by means of a vibrating air column which is driven by the activating oscillator.

15. The circuit according to claim 14 wherein said vibrating air column is excited by means of an electro-acoustical converter driven by the activating oscillator, and said vibrating air column preventing electromagnetic fields of said transducer from interfering with said vibrating capacitor.

16. The circuit according to claim 15 wherein one plate of said vibrating capacitor is mounted on a vibrating diaphragm, and said air column being fed via an air pipe from a remote vibrating transducer.

17. The circuit according to claim 2 further comprising a current conductor disposed in proximity to said vibrating capacitor. said current conductor being connected to an AC current generator generating an AC current of the same frequency as the vibrating frequency of said vibrating capacitor to compensate by phase tuning of said AC current generator with respect to the vibration of said capacitor for a residual disturbance factor, and said AC current through said conductor causing by induction a compensating AC voltage across said capacitor.

18. The circuit according to claim 2 further comprising a current conductor disposed in proximity to said vibrating capacitor, said current conductor being connected to an AC current generator generating an AC current of the same frequency as the vibrating frequency of said vibrating capacitor to compensate by amplitude tuning of said AC current generator with respect to the vibration of said capacitor for a residual disturbance factor, and said AC current through said conductor causing by induction a compensating AC voltage across said capacitor.

19. A measuring circuit for measuring a voltage in accordance with claim 1, wherein the capacitor is modulated at a predetermined frequency.

20. A high input impedance transducer for measuring a voltage of a voltage source comprising:
a first input tap and a second input tap adapted to be connected to the voltage source to be measured;
an amplifier means having a pair of adding inputs and a voltage output proportional to a sum of the inputs;
a modulated capacitor coupled between one of said input taps and one of the inputs of the amplifier means;
a voltage measuring means for measuring a voltage due to said modulation of said capacitor and producing an electrical signal proportional to the charge on the capacitor which has an input coupled to the output of the amplifier means and an output coupled to the other of the inputs of the amplifier means; and a negative feedback circuit coupled between the output of the amplifier means and the other one of the input taps, the output of the amplifier means being proportional to the voltage of said voltage source being measured.

21. A high gain transducer for measuring a voltage source in accordance with claim 20, wherein the capacitor is modulated at a predetermined frequency.

22. A method for measuring a voltage comprising:

providing a capacitor, disposed within a current path including a voltage source having the voltage to be measured;

producing a signal which is proportional to the charge on the capacitor;

adding said signal which is proportional to the charge on the capacitor to current flowing in the current path which is produced by the voltage source to produce a resultant signal;

negatively feeding back the resultant signal to said current path; and measuring a signal which is a function of the resultant signal as the voltage to be measured.

23. A method according to claim 22 wherein an AC signal component is produced at a predetermined frequency; and the AC signal component of said predetermined frequency is monitored and amplitude demodulated to produce said signal proportional to the charge.

24. A method according to claim 23 wherein said AC component signal is amplified prior to demodulation.

25. A method according to claim 23 wherein said AC signal component is a current signal which is added to said current flowing within said current path.

26. A method according to claim 22 wherein the open-loop gain of the negative feedback circuit is substantially higher than unit even when said AC signal component is disconnected from said addition to said signal dependent from said current flowing within said current path.

27. A method according to claim 26 wherein said open-loop gain is substantially higher than unity for signals of said predetermined frequency.

28. A method according to claim 23 wherein residual disturbance factors are compensated by coupling an AC signal to said current path with a frequency according to said predetermined frequency and compensation is performed by amplitude adjustment of said AC signal with respect to said capacitor vibration.

29. A method according to claim 23 wherein residual disturbance factors are compensated by coupling an AC signal into said current path with a frequency according to said predetermined frequency and compensation is performed by phase adjustment of said AC signal with respect to said capacitor vibration.

30. A method according to claim 28 or 29 wherein said AC signal is coupled into said current path by means of induction without galvanic contact with said current path.

31. A method according to claim 23 wherein said capacitor vibration is controlled by an electrical AC signal being used as a reference signal for said amplitude demodulation.

32. A method according to claim 23 wherein said capacitor is vibrated via a vibrating air column activated by means of an electro-magnetic transducer, the air column being such that said current path is not affected by leakage fields of said electro-magnetic transducer.

33. A method for measuring a voltage in accordance with claim 22, wherein the capacitor is modulated at a predetermined frequency.

* * * * *